United States Patent [19]

Sloan

[11] Patent Number: 5,431,700
[45] Date of Patent: Jul. 11, 1995

[54] VERTICAL MULTI-PROCESS BAKE/CHILL APPARATUS

[75] Inventor: Ben J. Sloan, Garland, Tex.

[73] Assignee: FSI International, Inc., Chaska, Minn.

[21] Appl. No.: 220,235

[22] Filed: Mar. 30, 1994

[51] Int. Cl.6 .................... H01L 21/68; H01L 23/40
[52] U.S. Cl. .................... 29/25.01; 432/241; 437/248
[58] Field of Search ............... 437/247, 248; 29/25.01; 432/241

[56] References Cited

U.S. PATENT DOCUMENTS

| 3,082,124 | 3/1963 | French et al. | 117/211 |
| 5,131,460 | 7/1992 | Krueger | 165/80.2 |
| 5,162,263 | 11/1992 | Kunishima et al. | 437/200 |
| 5,328,360 | 7/1994 | Yokokawa | 432/250 |
| 5,339,128 | 8/1994 | Tateyama et al. | 354/317 |
| 5,360,336 | 11/1994 | Monoe | 432/5 |

FOREIGN PATENT DOCUMENTS

| 61-105854 | 5/1986 | Japan | 29/25.01 |
| 63-232422 | 9/1986 | Japan | 437/248 |
| 298957 | 4/1990 | Japan | 437/248 |
| 341722 | 2/1991 | Japan | 29/25.01 |

Primary Examiner—Olik Chaudhuri
Assistant Examiner—David E. Graybill
Attorney, Agent, or Firm—Palmatier, Sjoquist, & Helget

[57] ABSTRACT

A multi-process bake/chill station for processing semiconductor wafers, comprising an insulated housing with an open bottom of approximately the same diameter as the wafer, a heated bake plate within the housing having a number of vertical gas flow passages through the plate, a plenum between the bake plate and the housing communicating with the gas flow passages, vent openings in the housing communicating with the plenum, a shroud for confining the wafer when it is in close proximity to the bake plate, a chill plate below the bake plate, and a lift for moving the wafer between the bake plate and the chill plate. The invention reduces contamination of the wafer by handling the wafer only minimally, increases the throughput of the manufacturing process by minimizing the extent of the mechanical movement between the bake plate and the chill plate, allows precise control of the time of the bake cycle and the chill cycle, and produces uniform heating of the wafer by minimizing air movement between the wafer and the bake plate.

7 Claims, 4 Drawing Sheets

VERTICAL MULTI-PROCESS BAKE/CHILL APPARATUS

BACKGROUND OF THE INVENTION

This invention relates to a bake/chill station for processing semiconductor wafers in the production of circuit chips, and more particularly to a bake/chill station wherein no intermediate handling step is required.

The processing of semiconductor wafers in the manufacture of circuit chips requires precise bake and subsequent rechill of the wafers, in order to cause a layer of material applied to the top surface of the wafer to set or harden.

The bake and chill steps are usually performed by separate bake plates and chill plates, with a mechanical move of the hot wafer between the plates. Such an approach presents a number of problems. First, the handling required by the mechanical move introduces the possibility of contamination of the wafer. Second, throughput of the manufacturing process is reduced, because of the mechanical move required between the plates. Third, the time of the bake cycle and the time of the chill cycle can not be precisely controlled, because of the time required to move the wafer to and from the respective plates. Fourth, the cost of equipment is higher than it need be, because the bake and chill plates are not integrated into one housing.

The bake plate is usually positioned below the wafer, so that the back side of the wafer is heated. Although this may reduce contamination of the top surface of the wafer, on which the desired material is layered, such positioning introduces other problems. Because of the toxic nature of solvents used for applying material to the surface of the wafer, such solvents must be prevented from escaping into the atmosphere. This is usually done by enclosing the bake plate and wafer in a process chamber and capturing the escaping solvent vapors. However, the lid of the process chamber will be the same temperature or cooler than the wafer, and therefore escaping solvent vapors can condense on the lid, and over a period of time this condensation produces solid particulates that may contaminate the surface of the wafer. Therefore, the lid needs to be cleaned periodically. Furthermore, because the bake plate is below the wafer, heated air tends to rise and generate convection currents that are very destructive to temperature uniformity.

SUMMARY OF THE INVENTION

In the processing of semiconductor wafers for circuit chips, a layer of some material, for example a photoresist, is applied to the surface of a wafer. The material is dissolved or suspended in a solvent. To remove the solvent and harden the material, the wafer must be baked and then chilled.

An object of the invention is to reduce contamination of the wafer by handling the wafer only minimally.

Another object of the invention is to increase the throughput of the manufacturing process by minimizing the extent of the mechanical move of the wafer between the bake plate and the chill plate.

Still another object of the invention is to precisely control the time of the bake cycle and the time of the chill cycle by minimizing the extent of movement of the wafer from a neutral position into the bake position, and from a neutral position into the chill position.

Another object of the invention is to allow the wafer to be maintained at a known temperature within the bake/chill station until it is ready for further processing.

Still another object of the invention is to produce very uniform heating of the wafer by minimizing air movement in proximity to the wafer.

Another object of the invention is to minimize the condensation of solvent vapors on surfaces above the wafer, thus minimizing contamination of the wafer by solid particulates from such condensation.

A feature of the invention is a bake plate positioned above the wafer. Because the bake plate is hotter than the wafer, there will be very little condensation on the surface of the bake plate confronting the wafer, and therefore very little contamination of the wafer due to solid particulates from such condensation.

Another feature of the invention is an insulated housing for the bake plate having an open bottom whereby a wafer may be inserted, the open bottom being of approximately the same diameter as the wafer, i.e., within 0.25 inch of the wafer's diameter, the wafer thus acting as a door. The housing also has a shroud which encloses the bake plate and extends below the bake plate. The shroud and close fitting of the housing to the wafer combine to minimize air currents flowing across the wafer, thus minimizing temperature variation in the wafer.

Another feature of the invention is that the heated bake plate is positioned in such a manner that the wafer may be brought into very close proximity, i.e., 0.010 inch or less, to the bake plate. The small space thus created minimizes air movement above the wafer, thus producing very uniform heating of the wafer and minimizing condensation above the wafer while preventing damage to the photoresist film. The bake plate also has holes through it which allow gases from the wafer to pass through the bake plate to a plenum chamber above the bake plate for removal from the bake/chill module. The plenum chamber preferably has a slight vacuum, facilitating movement of gases from the wafer through the holes in the bake plate. This arrangement also minimizes air movement around the edges of the wafer.

Another feature of the invention is that the shroud has a series of small holes in it that communicate with the plenum, preventing any harmful vapor that may escape below the wafer from escaping into the environment.

Another feature of the invention is a chill plate below the insulated housing, positioned in such a manner that the wafer may be brought into very close proximity, i.e., 0.010 inch or less, to the chill plate. The close proximity of the back side of the wafer to the cool chill plate produces uniform cooling of the wafer, yet the wafer does not touch the chill plate, thus possible back-side contamination of the wafer is minimized.

Still another feature of the invention is a lift for moving the wafer vertically between the bake plate and the chill plate, and for returning the wafer to an intermediary position for removal from the bake/chill station by a robot arm. The short distance between the intermediary station and the bake station and chill station provides for precise control over the length of the bake cycle and chill cycle. Furthermore, the vertical orientation between the bake station and chill station provides for minimal movement of the wafer, thus reducing the chance of contamination by particulate. Also, the wafer may be maintained at room temperature on the cool chill plate while it is awaiting further processing.

Another feature of the invention is the integration of the bake station and the chill station into one module, thus reducing component costs and improving throughput of the manufacturing process by minimizing the number of robot moves.

DETAILED SPECIFICATION OF THE PREFERRED EMBODIMENTS

Figure 1:
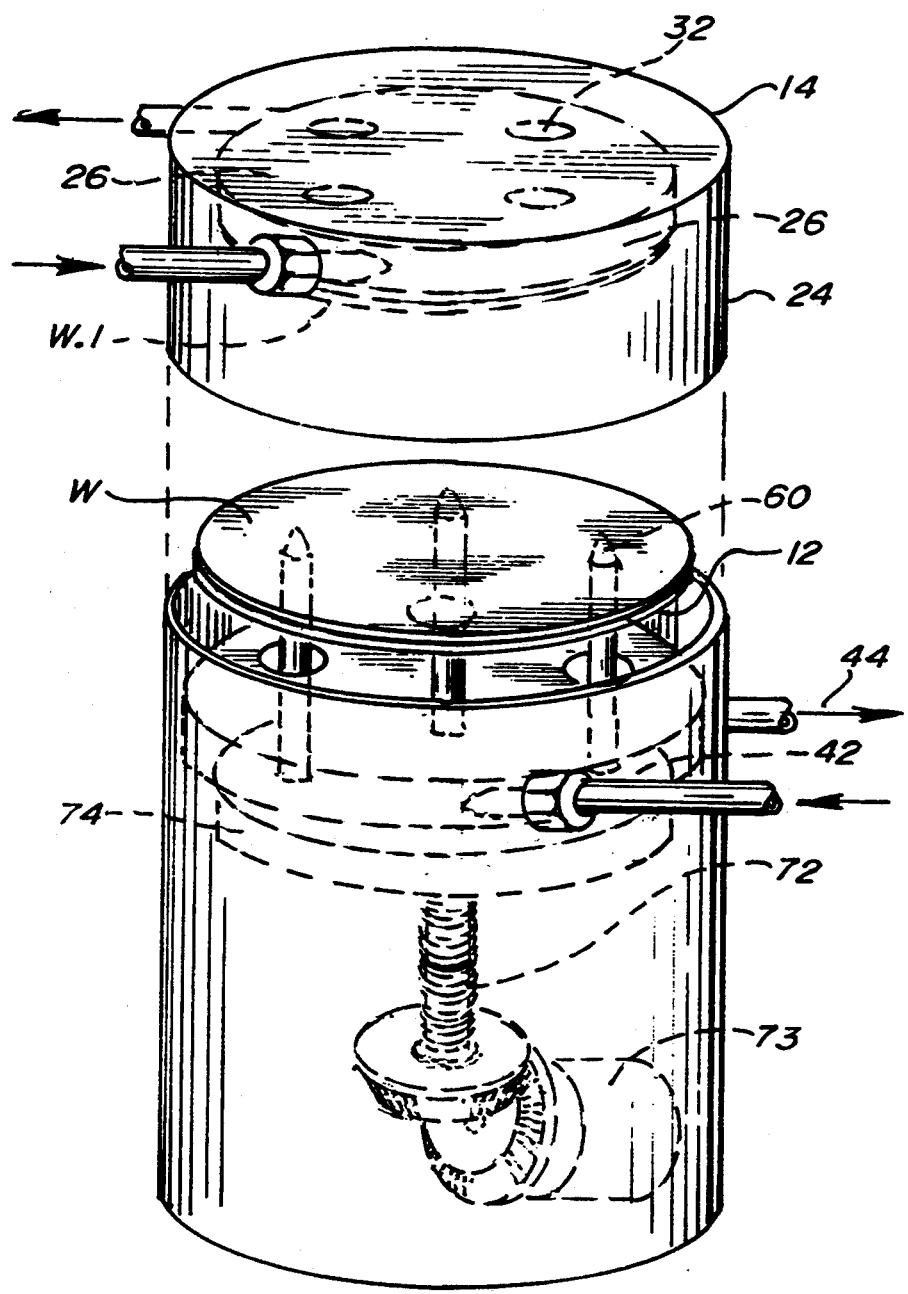
FIG. 1 is a perspective view of the invention with some internal structure shown.
Figure 2:
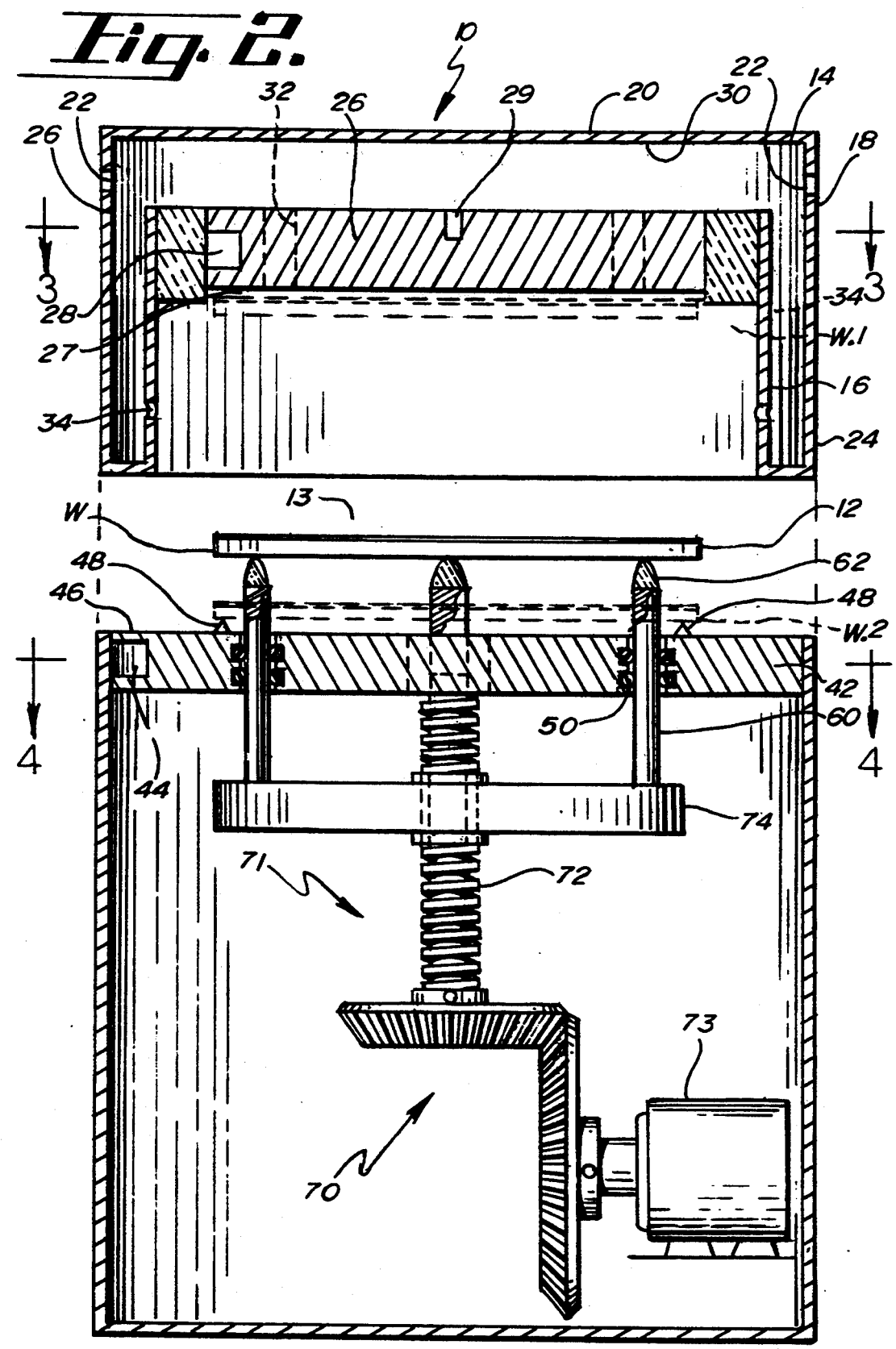
FIG. 2 is a schematic of the invention.
Figure 3:
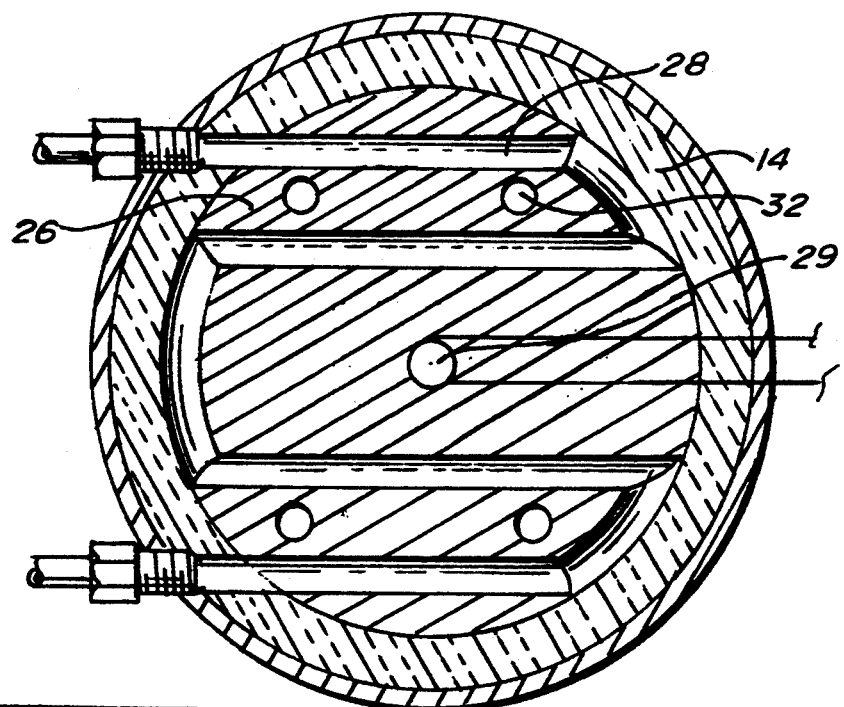
FIG. 3 is a cross-section at line 3—3 in FIG. 2.
Figure 4:
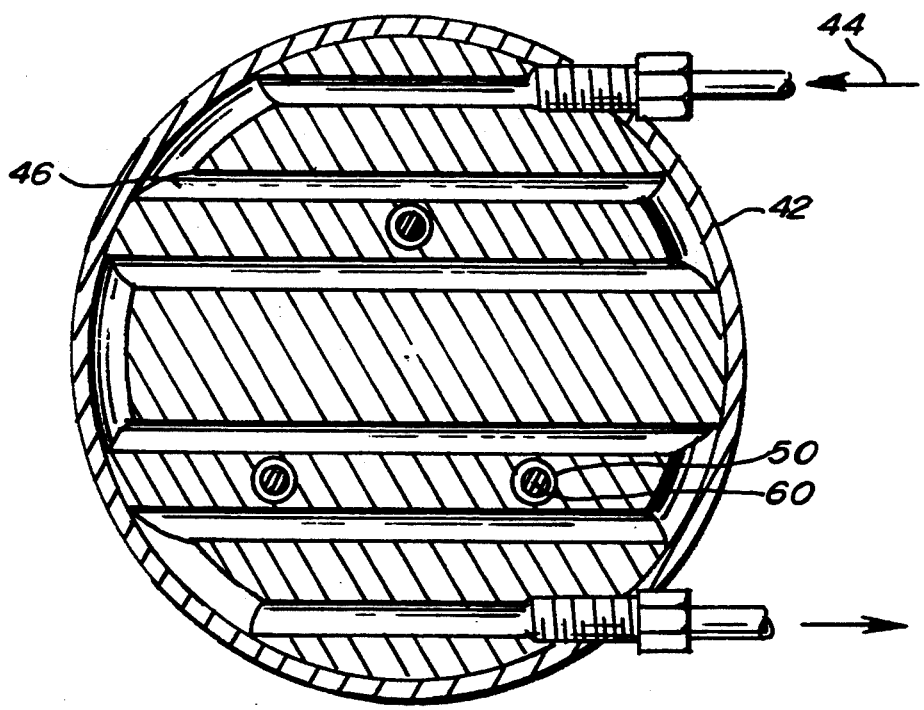
FIG. 4 is a cross-section at line 4—4 of FIG. 2.

The bake/chill apparatus is shown generally in FIGS. 1 and 2 and denominated therein by the numeral 10. A wafer 12 having a layer of photoresist 13 on its upper surface is shown in solid lines at full line position W. A wafer heating means is embodied as an insulated housing 14 having an open bottom 16 of approximately the same diameter as the wafer, i.e., within 0.25 inch, and an upper portion 18 with a top wall 20 and a plurality of exhaust openings 22. The housing 14 also has a downwardly extending shroud or sidewall 24, to receive the wafer as the wafer is lifted into its upper position W.1, shown in dashed lines. The wafer 12 cooperates with the shroud 24 to form a door to the housing 14. The housing 14 also has a heated bake plate 26 confined therein which heats the wafer. The bake plate 26 is made of thermoconducting material, such as aluminum. The housing 14 is insulated from the bake plate 26 by a suitable non-conductive material. The space 27 between the bake plate 26 and the wafer 12 in the upper position W.1 is less than 0.010 inch. The bake plate 26 is heated by an electric resistance heater 28 preferably embedded in the plate 26 or by other suitable means. The heater 28 is regulated by a regulator 29 such as a thermocouple or a platinum resistance thermometer.

The bake plate 26 is spaced slightly from the top wall 20 of the housing 14 as to define a small plenum chamber 30. The bake plate 26 also has a plurality of gas flow passages 32 to allow gases to pass upwardly from the wafer 12 into the plenum chamber 30. A very slight negative air pressure may be maintained in the plenum so as to facilitate the removal of gases. The exhaust openings 22 remove gases collected in the plenum chamber 30.

The plenum also extends along the inside of the shroud 24. A plurality of small, i.e., approximately one-tenth inch, holes 34 allow vapors from the wafer 12 to enter the plenum and thus to be exhausted from the bake/chill module.

A wafer cooling means is shown embodied as a chill plate 42. The chill plate 42 utilizes cooling fluid 44, for example water, passing through a passage 46 in the chill plate for cooling the plate 42 to its desired temperature. The chill plate 42 carries a plurality of support pins 48 which support the wafer 12. When the wafer 12 is in its lowermost position W.2, the wafer rests upon the pins 48 and is spaced from the chill plate 42 a distance of less than 0.010 inch. The chill plate has a number of vertical passages 50 therethrough for accommodating movement of the wafer's vertical supports, as will be described below.

The wafer 12 is supported horizontally on a wafer supporting means. The wafer supporting means comprises a number of vertical supports 60. The vertical supports 60 have insulated tips 62 upon which the wafer rests, in order to avoid localized cooling by the supports during the baking process. The vertical supports slide through passages 50 in the chill plate 42.

The bake/chill apparatus also comprises a lift means for precisely raising and lowering the wafer vertically. The lift means comprises a lift 70 consisting of a precision lifting mechanism 71 and a lift platform 74. The precision lifting mechanism may be embodied in any manner that allows precise positioning of a wafer in proximity to the bake plate. One implementation, shown in FIG. 2, comprises a precision lead screw 72, driven by an encoder/resolver 73 through appropriate gearing. The lead screw has a pitch of about 0.050 inches per revolution and the encoder/resolver is capable of resolving 3.6 degrees of arc. The combination of the encoder/resolver and lead screw would thus be capable of an incremental vertical motion of 0.0005 inches.

The vertical supports 60 are connected vertically to the horizontal lift platform 74. As the vertical supports slide through the passages 50 in the chill plate 42, the lift 70 precisely positions the wafer 12 at an upper position W.1, at a full line position W, and at a lower position W.2.

When the process utilizing this bake/chill module is started, an external robot arm will carry the wafer 12 and place it onto the insulated tips 62 of the vertical supports 60 at the full line position W. At this time, the photoresist 13 on the wafer is fresh and has just been applied. The robot arm would then withdraw from the bake/chill apparatus.

The bake plate 26 will have been heated to a temperature typically in the range of 70° C. to 200° C. by the heater 28 and will be maintained at a precise temperature in this range by means of the thermocouple 29. The lift 70 precisely lifts the wafer 12 into the bake position W.1 and the shroud 24 will confine the heat in the vicinity of the wafer 12 at position W.1 and will minimize any flow of gases around the wafer 12. Because the wafer 12 is very close to the bake plate 26, heat is uniformly transferred by conduction across the space 27 as to bake the resist 13, as appropriate for the intended process. During the baking process, casting solvent is vaporized from the photoresist 13 on the wafer and the vapors of the solvent are allowed to escape through the gas flow passages 32 in the bake plate 26 and through the plenum 30 and exhaust openings 22. The plenum preferably has a slight vacuum, facilitating the exhaust of the gases. Any vapors that are not exhausted through the gas flow passages 32 are removed through the holes 34 in the shroud 24, and thus enter the plenum 30 for exhaustion from the module.

Because the bake plate 26 is above the wafer 12, convection currents will be minimized. Since the bake plate 26 is hotter than the wafer 12, vaporized solvent from the photoresist 13 will not condense on the bake plate, but instead will be exhausted from the plenum as described above. When a suitable baking time, in the range of 45 seconds to 90 seconds, nominally 60 seconds, has elapsed, the photoresist 13 will have been processed, and the lift 70 is operated to lower the wafer 12 from the position W.1 to the lower chill position W.2. This move takes place rapidly because of the proximity of the bake plate to the chill plate. At position W.2, the bottom face of the wafer is located in close proximity to the chill plate 42 and spaced from the chill plate 42 by approximately 0.010 inches or less. The close proximity of the wafer 12 to the chill plate 42 allows even cooling of the wafer while minimizing the risk of the wafer being contaminated. The chill plate 42 will have already been cooled to approximately room temperature. The cool chill plate 42 absorbs heat from the wafer 12 in the position W.2 and cools the wafer to the desired temperature for further processing.

When an appropriate cooling time has elapsed, the lift 70 is operated to return the wafer 12 to the full line position W so that a robot may then pick up the wafer and remove it from the bake/chill module and thereafter replace the wafer with another similar wafer for processing. Alternatively, the wafer 12 may remain at position W.2 in proximity to the chill plate until the robot process is ready to move the wafer to the next station. Thus, the wafer 12 will remain at a known temperature until it is ready for further processing.

Figure 5:
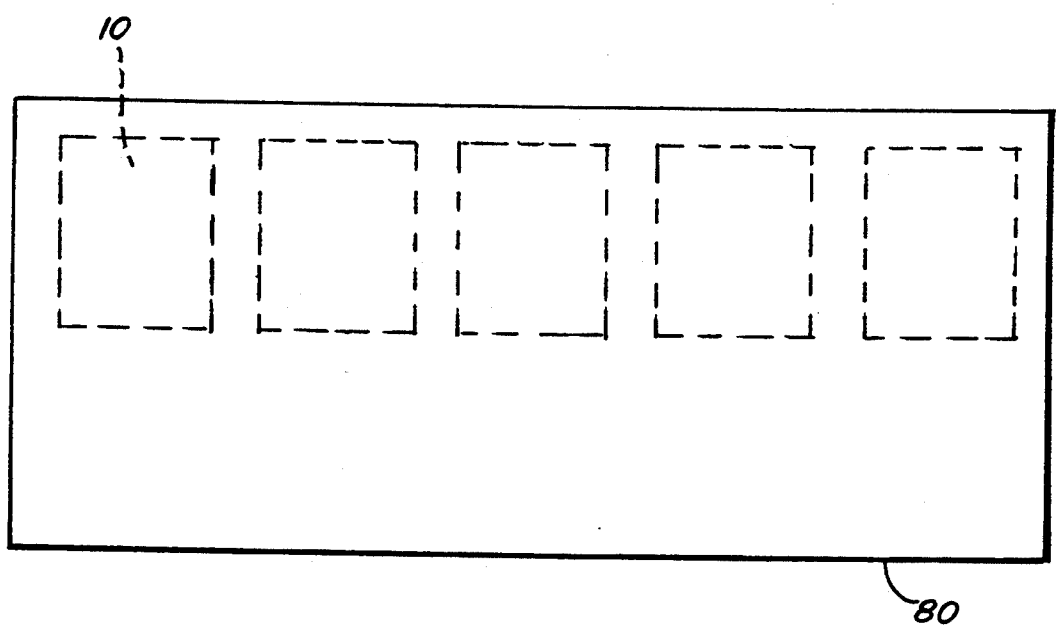
FIG. 5 is a schematic of a module holding five of the bake/chill stations.

Multiple bake/chill stations 10 may be housed, as shown in FIG. 5, in a larger module 80.

It will be seen that a multi-process bake/chill station has been described. This bake/chill station has several advantages. First, the wafer 12 is handled only minimally, to avoid any jostling of it and the possible creation of particulates, which are considered contaminants. Second, the time of the bake cycle and the time of the chill cycle may be very accurately controlled because of the minimal movement of the wafer 12 as it moves in and out of the position W.1 for baking and in and out of the position W.2 at which it is cooled. Third, the heating of the wafer 12 during baking is very uniform because there is practically no movement of air in the space 27 between the wafer 12 and the bake plate 26. Also, the small space 27 between the wafer 12 and the bake plate 26 minimizes condensation above the wafer. Fourth, the cost of components is decreased by integrating the bake station and the chill station into one module, and the throughput of the manufacturing process is increased by minimizing the number of robot moves.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. A multi-process bake/chill station for processing semiconductor wafers, comprising:
    a wafer supporting means for receiving and orienting the wafer to lie substantially horizontally;
    a wafer heating means for uniformly heating portions of the wafer comprising a bake plate above the wafer to confront the wafer in spaced relation when the wafer is brought into proximity with said heating means;
    a wafer cooling means for uniformly cooling portions of the wafer comprising a generally flat surface portion to confront the wafer in spaced relation when the wafer is brought into proximity with said cooling means,
    said heating means being positioned above said cooling means, said heating means being vertically spaced from said cooling means; and
    a lift means connected with said wafer supporting means providing precise raising and lowering of the wafer vertically, through the space between said heating means and said cooling means, so that the wafer is alternately brought into proximity, with said heating means and with said cooling means.

2. A multi-purpose bake/chill station as in claim 1, wherein said heating means further comprises:
    an insulated housing confining said flat surface;
    said housing comprising an open bottom and comprising an upper portion with a plurality of vent openings, the upper portion also having a top wall, said bottom being of approximately the same diameter as the wafer;
    said bake plate having an electrical resistance heater and having a plurality of vertically-extending gas flow passages therethrough, said bake plate being spaced from the top wall of said housing as to define a chamber therebetween, said chamber communicating with the vent openings in said housing and with said gas flow passages; and
    a downwardly-extending shroud for confining the wafer when the wafer is brought into vertical proximity to said bake plate, the wafer thereby acting as a door, said chamber extending along the inside walls of said shroud, said shroud having a plurality of small openings which communicate with said chamber.

3. A multi-process bake/chill station as in claim 1 wherein said cooling means further comprises a chill plate with a passage therethrough for the circulation of cooling fluid and having a plurality of support pins on its upper surface for supporting the wafer.

4. A multi-process bake/chill station as in claim 3, wherein said lift means further comprises a precision lifting mechanism and lift platform positioned below said chill plate, wherein said wafer supporting means comprises a plurality of substantially vertical supports, each such support having an insulated tip for supporting the wafer, said supports being fixed to said lift platform and wherein said chill plate has a number of substantially vertical passages therethrough, for accommodating the movement of said supports through said chill plate.

5. A multi-process bake/chill station as in claim 4, wherein the vertical separation between the wafer and said bake plate is less than 0.010 inch when the wafer is in proximity to said bake plate, and wherein the vertical separation between the wafer and said chill plate is less than 0.010 inch when the wafer is in proximity to said chill plate.

6. A multi-process bake/chill station for processing semiconductor wafers, comprising:
    a plurality of substantially vertical supports having insulated tips for receiving and orienting the wafer to lie substantially horizontally;
    a lift connected with said supports providing raising and lowering of the wafer on said supports;
    an insulated housing positioned above said supports for receiving the wafer for heating, said housing having an open bottom and comprising an upper portion with a plurality of vent openings, said upper portion also having a top wall, said bottom opening being of approximately the same diameter as the wafer, said housing confining therein by means of a downwardly extending shroud, a bake plate with a substantially flat bottom surface for confronting the wafer, said bake plate having an electrical resistance heater and having a plurality of vertically-extending gas flow passages therethrough, said bake plate being spaced from the top wall of said housing as to define a chamber therebetween, said chamber communicating with said vent openings in said housing and with said gas flow passages, said chamber also extending along the inside walls of said shroud, said shroud having a plurality of small openings which communicate with said chamber;

a chill plate positioned below said bake plate, said chill plate having a passage therethrough for the circulation of cooling fluid and having a plurality of support pins on its upper surface for supporting the wafer, said chill plate also having a plurality of substantially vertical passages therethrough for accommodating the movement of said supports through said chill plate;

said lift being positioned below said chill plate, said lift comprising a precision lifting mechanism and a horizontal lift platform fixed to said supports and being capable of raising and lowering the wafer so that the wafer comes alternately into close proximity with said bake plate and said chill plate.

7. A multi-process bake/chill station as in claim 6, wherein the vertical separation between the wafer and said bake plate is less than 0.010 inch when the wafer is in proximity to said bake plate, and wherein the vertical separation between the wafer and said chill plate is less than 0.010 inch when the wafer is in proximity to said chill plate.

* * * * *